US012278300B2

(12) United States Patent
Van Den Heuvel et al.

(10) Patent No.: US 12,278,300 B2
(45) Date of Patent: Apr. 15, 2025

(54) PHOTOVOLTAIC ELEMENT

(71) Applicant: SABIC GLOBAL TECHNOLOGIES B.V., Bergen op Zoom (NL)

(72) Inventors: Huibert Johan Van Den Heuvel, Eindhoven (NL); Rick Robert Emilie Bercx, Herten (NL); Roland Van Giesen, Nederweert (NL); Robert Walter Venderbosch, Bergen op Zoom (NL); Henrica Norberta Alberta Maria Steenbakkers-Menting, Susteren (NL); Maud Van Der Ven, Bingelrade (NL); Petya Dochkova Yaneva, Maastricht (NL)

(73) Assignee: Sabic Global Technologies B.V., Bergen op Zoom (NL)

( * ) Notice: Subject to any disclaimer, the term of this patent is extended or adjusted under 35 U.S.C. 154(b) by 115 days.

(21) Appl. No.: 17/641,867

(22) PCT Filed: Sep. 18, 2020

(86) PCT No.: PCT/EP2020/076168
§ 371 (c)(1),
(2) Date: Mar. 10, 2022

(87) PCT Pub. No.: WO2021/053180
PCT Pub. Date: Mar. 25, 2021

(65) Prior Publication Data
US 2022/0328710 A1     Oct. 13, 2022

(30) Foreign Application Priority Data
Sep. 19, 2019   (EP) ..................................... 19198192

(51) Int. Cl.
*H01L 31/048*     (2014.01)
*H01L 31/049*     (2014.01)

(52) U.S. Cl.
CPC ........ *H01L 31/0481* (2013.01); *H01L 31/049* (2014.12)

(58) Field of Classification Search
CPC ............... H01L 31/048; H01L 31/0481; H01L 31/0488; H01L 31/049
See application file for complete search history.

(56) References Cited

U.S. PATENT DOCUMENTS

2008/0108757 A1\*  5/2008  Hoya ..................... C08L 23/142
                                                              525/240
2009/0000222 A1   1/2009  Kalkanoglu et al.
(Continued)

FOREIGN PATENT DOCUMENTS

EP        3281973 A1     2/2018
WO     2006010414 A1     2/2006
(Continued)

OTHER PUBLICATIONS

English machine translation of Fukuda (WO-2014065251-A1) provided by the EPO website, All Pages, 2024. (Year: 2024).\*
(Continued)

*Primary Examiner* — Daniel P Malley, Jr.
(74) *Attorney, Agent, or Firm* — CANTOR COLBURN LLP

(57) ABSTRACT

The invention relates to a photovoltaic module comprising (a) a front layer (1) arranged on the sunlight facing side of the photovoltaic module, wherein the front layer (1) comprises a first polypropylene composition, comprising a polypropylene, wherein the transmission of the front layer for light in the wavelength range of 350 nm to 1200 nm is on average at least 65% as compared to a situation without the front layer as determined according to ASTM D1003-13, (b) a sealing layer (2,4) which at least partly encapsulates a plurality of photovoltaic cells (3), wherein the sealing layer (2, 4) comprises a polyolefin elastomer composition com-
(Continued)

prising an ethylene-α-olefin copolymer and (c) a back layer (5), wherein the back layer (5) comprises a first reinforced polypropylene layer comprising a second polypropylene composition comprising a polypropylene and optionally a reinforcing filler, wherein the sealing layer is arranged between the front layer and the back layer.

14 Claims, 2 Drawing Sheets

(56) References Cited

U.S. PATENT DOCUMENTS

| | | | |
|---|---|---|---|
| 2011/0272025 A1 | 11/2011 | Cheng | |
| 2014/0238468 A1* | 8/2014 | Brounne | H01L 31/048 136/251 |
| 2016/0002440 A1* | 1/2016 | Maeyama | C08K 5/14 524/99 |
| 2016/0032064 A1* | 2/2016 | Yoda | B32B 17/10788 524/517 |
| 2016/0060443 A1* | 3/2016 | Hoya | C08F 8/46 524/528 |
| 2019/0074394 A1 | 3/2019 | Flendrig et al. | |
| 2019/0177520 A1* | 6/2019 | Aarnio-Winterhof | C08K 3/34 |
| 2019/0259893 A1 | 8/2019 | Kimura et al. | |
| 2021/0305445 A1* | 9/2021 | Van Giesen | H01L 31/049 |
| 2022/0059713 A1 | 2/2022 | Selten et al. | |

FOREIGN PATENT DOCUMENTS

| | | | |
|---|---|---|---|
| WO | 2009080281 A1 | 7/2009 | |
| WO | 2012070245 A1 | 5/2012 | |
| WO | WO-2013118570 A1 * | 8/2013 | ....... B32B 17/10018 |
| WO | WO-2014065251 A1 * | 5/2014 | ................ C08F 8/42 |
| WO | 2016142786 A1 | 9/2016 | |
| WO | 2018087366 A1 | 5/2018 | |
| WO | WO-2018122203 A1 * | 7/2018 | ........... H01L 31/048 |
| WO | 2019122317 A1 | 6/2019 | |

OTHER PUBLICATIONS

English machine translation of Kato (WO-2013118570-A1) provided by the EPO website, All Pages, 2024. (Year: 2024).*
International Search Report for the corresponding International Application No. PCT/EP2020/076168; International Filing Date: Sep. 18, 2020; Date of Mailing: Dec. 11, 2020; 4 pages.
Written Opinion for the corresponding International Application No. PCT/EP2020/076168; International Filing Date: Sep. 18, 2020; Date of Mailing: Dec. 11, 2020; 6 pages.

* cited by examiner

PHOTOVOLTAIC ELEMENT

CROSS-REFERENCE TO RELATED APPLICATIONS

This application is a National Stage application of PCT/EP2020/076168, filed Sep. 18, 2020, which claims benefit of European Application No. 19198192.7 filed on Sep. 19, 2019, both of which are incorporated by reference herein in their entirety.

The invention relates to a photovoltaic module, a process for the preparation of said photovoltaic module and the use of such photovoltaic module.

US2008/0108757 A1 discloses a thermoplastic resin composition that gives a solar cell sealing sheet having, even without being crosslinked, good mechanical strength, solar cell sealability, transparency, and weatherability. The thermoplastic resin composition of the present invention comprises 1 to 95% by weight of a propylene-based polymer (A) and 5 to 99% by weight of a copolymer (B) with at least one α-olefin having 2 to 20 carbon atoms other than propylene, wherein (A) satisfies the following (i) and (ii), and (B) has a melting point below 80° C. or does not show a melting point as measured by a differential scanning calorimeter (DSC): (i) Melting point measured by a differential scanning calorimeter (DSC) method is in the range of 80 to 135° C. (ii) Endotherm attributable to crystal melting is not observed at 140° C. or more in the endothermic curve measured by a differential scanning calorimeter (DSC) method.

WO2018/122203A1 discloses a photovoltaic packaging, comprising:
a polymer back layer,
a plurality of photovoltaic cells electrically connected to each other by electrical conductors,
a polymer front layer which is transparent to light, and which is configured to be connected to the polymer back layer by means of welding,
wherein the plurality of mutually connected photovoltaic cells are located between the front layer and the back layer, the front layer and the back layer being locally connected to each other by means of a local welded connection, such that the plurality of photovoltaic cells is completely enclosed between the front layer and the back layer by the welded connection, surrounding the plurality of photovoltaic cells, and wherein each individual cell of the plurality of photovoltaic cells is separated from the remaining of the photovoltaic cells by the welded connection.

DE 11 2016 006 018T5 discloses in example 1 a solar battery module comprising a surface layer of polycarbonate which is arranged on a sunlight side of the solar battery module and is made of a plastic; a sealing layer which seals the solar battery cell, wherein the top sealing layer is an ethylene-vinyl-acetate and wherein the bottom sealing layer is a polyolefin. It further has a metal layer under the bottom sealing layer, then a foamed polypropylene layer and a second metal layer located at the bottom side of the bottom sealing layer.

A disadvantage of such solar battery module is that the solar battery module is not easily recyclable.

Therefore, it is the object of the invention to provide a photovoltaic module which is easily recyclable, but which is lightweight and easy to manufacture (at low cost) at the same time.

This object is achieved by a photovoltaic module comprising (a) a front layer (1) arranged on the sunlight facing side of the photovoltaic module, wherein the front layer (1) comprises a first polypropylene composition, comprising a polypropylene, wherein the transmission of the front layer for light in the wavelength range of 350 nm to 1200 nm is on average at least 65% as compared to a situation without the front layer as determined according to ASTM D1003-13, (b) a sealing layer (2,4) which at least partly encapsulates a plurality of photovoltaic cells (3), wherein the sealing layer (2, 4) comprises a polyolefin elastomer composition comprising an ethylene-α-olefin copolymer and (c) a back layer (5), wherein the back layer (5) comprises a first reinforced polypropylene layer comprising a second polypropylene composition comprising a polypropylene and optionally a reinforcing filler, wherein the sealing layer is arranged between the front layer and the back layer.

The use of only polyolefins in the photovoltaic module allows for an easy recyclability of the photovoltaic module.

At the same time, the use of polyolefins allows for a lightweight solution.

Furthermore, it has been found that the photovoltaic module of the invention can easily be prepared, for example by lamination.

In addition, the presence of a sealing layer in the photovoltaic module allows for a good adhesion between the front layer, the sealing layer and the back layer and does not require the use of a glue or of a tie layer, such as an ethylene-vinylalcohol copolymer (EVOH).

In addition, the mechanical properties of the photovoltaic module of the invention are good, for example the presence of the first reinforced polypropylene back layer in the photovoltaic module ensures a good impact resistance, for example a good hail impact resistance.

In addition, the electrical properties of the photovoltaic module of the invention are good and are sufficient for passing the International Electrotechnical Commission (IEC) requirements for solar panels measured in accordance with IEC61215-2:2016.

Front Layer of the Photovoltaic Module

The photovoltaic module of the invention comprises (a) a front layer (1) arranged on the sunlight facing side of the photovoltaic module, wherein the front layer (1) comprises a first polypropylene composition, comprising a polypropylene, wherein the transmission of the front layer for light in the wavelength range of 350 nm to 1200 nm is on average at least 65% (for a good conversion of the sunlight to energy by the photovoltaic cells), for example on average at least 70%, for example on average at least 75%, for example on average at least 80% as compared to a situation without the front layer, wherein the transmission for light in the wavelength range of 350 nm to 1200 nm is determined according to ASTM D1003-13.

The front layer may be prepared using methods known per se, for example via extrusion of the composition from which it is prepared.

Therefore, the front layer preferably comprises a first polypropylene composition which has a transmission for light in the wavelength range of 350 nm to 1200 nm of on average at least 65%, for example on average at least 70%, for example on average at least 75%, for example on average at least 80% as compared to a situation without the first polypropylene composition, wherein the transmission for light in the wavelength range of 350 nm to 1200 nm is determined according to ASTM D1003-13.

For a good recyclability, it is preferred that the front layer comprises at least 95 wt % of the polypropylene composition based on the front layer, more preferably at least 96 wt %, more preferably at least 97 wt %, for example at least 98 wt %, for example at least 99 wt %, for example at least 99.5 wt % of the first polypropylene composition based on the front layer. For example the front layer consists of the first polypropylene composition.

The First Polypropylene Composition

The first polypropylene composition preferably comprises at least 95 wt % of a polypropylene, more for example at least 96 wt %, for example at least 97 wt %, for example at least 98 wt %, for example at least 98.5 wt %.

The advantage of using polypropylene in such high amounts is that it provides a good moisture barrier.

The first polypropylene composition may contain additives. Suitable examples of additives are known to the person skilled in the art and include but are not limited to clarifiers, stabilizers, e.g. UV stabilizers or heat stabilizers, acid scavengers, release agents, plasticizers, anti-oxidants, lubricants, anti-statics, scratch resistance agents, recycling additives, coupling agents, anti-microbials, anti-fogging additives, slip additives, anti-blocking additives, polymer processing aids, organic peroxides to control melt rheology, and the like. Such additives are well known in the art. The skilled person will know how to employ these additives in conventional effective amounts.

The amount of additives depends on their type and function; typically is up to about a maximum of 5 wt % of additives, based on the polypropylene composition.

In order to preserve the transmission over time (UV resistance and weatherability), the first propylene composition of the invention may for example further comprise light stabilizing additives and UV stabilizers.

As an example, for increasing the UV resistance and weatherability, the first polypropylene composition may further comprise a mixture of light stabilizing additives, said light stabilizer additive mixture comprising:
  i) a high molecular weight hindered tertiary amine light stabilizer having a weight average molecular weight (measured by ASTM D6474-12) of at least 1600 g/mol, for example 1,3,5-triazine-2,4,6-triamine, N,N'''-[1,2-ethanediylbis [[[4,6-bis[butyl(1,2,2,6,6-pentamethyl-4-piperidinyl)amino]-1,3,5-triazine-2-yl]imino]-3,1-propanediyl]]-bis[N',N''-dibutyl-N',N''-bis(1,2,2,6,6-pentamethyl-4-piperidinyl);
  ii) a low molecular weight hindered secondary amine light stabilizer (s-LM-HALS) having a weight average molecular weight (measured by ASTM D6474-12) of below 1000 g/mol, for example mixture of esters of 2,2,6,6-tetra-methyl-4-piperidinol and one or more fatty acids,
  iii) an ultraviolet synergist, for example an n-alkyl-3,5-dialkylated 4-hydroxybenzoate, for example n-hexadecyl 3,5-di-t-butyl-4-hydroxybenzoate and
  iv) an ultraviolet absorber, for example 2-(2'-5 hydroxy-3'-t-butyl-5'-methylphenyl)-5-chlorobenzotriazole
and c) a mixture of antioxidant additives, said antioxidant mixture comprising
  i) a phenolic antioxidant, for example tetrakis[methylene-3(3',5'-di-t-butyl-4-hydroxyphenyl)propionate] methane or 1,3,5-tris(4-t-butyl-2,6-dimethyl-3-hydroxybenzyl)-isocyanurate and
  ii) a phosphite additive, for example tris (2,4-di-t-butylphenyl) phosphite
and optionally calcium stearate.

The polypropylene present in the first polypropylene composition is preferably a polypropylene having a transmission for light in the wavelength range of 350 nm to 1200 nm of on average at least 65%, for example at least of an average at least 70%, for example of an average at least 75%, for example of an average at least 80% as compared to a situation without the polypropylene as determined according to ASTM D1003-13.

For example, a suitable polypropylenes may be a propylene homopolymer or a propylene copolymer, for example a propylene-ethylene copolymer.

Comonomers in the propylene copolymer include but are not limited to moieties derived from ethylene, α-olefins having from 4 to 12 carbon atoms, for example $C_4$ α-olefin, for example 1-butene; $C_5$ α-olefin, $C_6$ α-olefin, for example 1-hexene; $C_7$ α-olefin, $C_8$ α-olefin, for example 1-octene; $C_9$ α-olefin, $C_{10}$ α-olefin, $C_{11}$ α-olefin or $C_{12}$ α-olefin; and mixtures thereof. Preferably, the comonomer in the propylene copolymer is a moiety derived from ethylene; the propylene copolymer will then be a propylene-ethylene copolymer.

The amount of moieties derived from ethylene, α-olefins having from 4 to 12 carbon atoms or mixtures thereof in the propylene copolymer may for example range from 1.0 to 7.0 wt %, for example in the range from 2.0 to 5.0 wt % based on the propylene copolymer.

A example of a transparent heterophasic propylene copolymer is disclosed in WO2006010414A1.

To be able to prepare a front layer via extrusion having a uniform thickness and/or with an acceptable high speed processing behavior, it is preferred that the polypropylene in the polypropylene composition has a molecular weight distribution (MWD) of at least 4.0, for example at least 5.0, for example at least 6.0 and/or at most 12, for example at most 10.9.0, for example the propylene homopolymer or propylene-ethylene copolymer according to the invention has a molecular weight distribution in the range from 5.0 to 10.0, wherein MWD is calculated by dividing the weight average molecular weight Mw by the number average molecular weight Mn and wherein Mw and Mn are measured according to ASTM D6474-12.

The melt flow rate of the polypropylene composition is preferably in the range from 0.10 to 10 dg/min, for example in the range from 0.25 to 2.5 dg/min, for example in the range from 0.5 to 2.0 as determined using ISO1133:2011, at 2.16 kg and 230° C. Such melt flow rates are suitable for extrusion.

The person skilled in the art is aware how to prepare propylene homopolymers, propylene copolymers and heterophasic propylene copolymers. The preparation of such polypropylenes is, for example, described in Moore, E. P. (1996) Polypropylene Handbook. Polymerization, Characterization, Properties, Processing, Applications, Hanser Publishers: New York.

Propylene homopolymers, propylene copolymers and heterophasic propylene copolymers can be made by any known polymerization technique as well as with any known polymerization catalyst system. Regarding the techniques, reference can be given to slurry, solution or gas phase polymerizations; regarding the catalyst system reference can be given to Ziegler-Natta, metallocene or single-site catalyst systems. All are, in themselves, known in the art. In addition, propylene homopolymers, propylene copolymers and heterophasic propylene copolymers are commercially available.

For example, the propylene copolymer may be a propylene homopolymer or propylene-ethylene copolymer, for example a propylene-ethylene copolymer having an amount of moieties derived from ethylene in the range from 1.0 to 7.0 wt % based on the propylene-ethylene copolymer, wherein the propylene homopolymer or propylene-ethylene copolymer has i) a molecular weight distribution (MWD) of at least 5.0 and at most 10.0, wherein MWD is calculated by dividing the weight average molecular weight Mw by the number average molecular weight Mn and wherein Mw and Mn are measured according to ASTM D6474-12 and/or ii) a melt flow rate in the range from 0.50 to 7.0 dg/min as determined using ISO1133:2011, at 2.16 kg and 230° C.

The front layer may further comprise a protective coating. For example, for increasing the UV-resistance of the front layer, a UV protective coating may be present on the front layer on the sunlight facing side of the photovoltaic module. Said protective coating may be applied to said front layer prior to assembly of the front layer into the photovoltaic module, or may be applied after assembly of the front layer into the photovoltaic module.

The thickness of the front layer is chosen such that the light transmission is optimal and the weight is not too high, while at the same time the thickness of the front layer needs to be sufficient to protect the other layers of the photovoltaic module.

For example, the thickness of the front layer may be chosen in the range from 0.05 to 4.0 mm for example in the range from 0.05 to 2.0 mm.

The front layer may have a smooth surface on the side facing the sunlight as well as on the side facing the sealing layer. However, the front layer may for example also have a textured surface on the sunlight facing side as it has been found that this does not significantly affect the transmission of sunlight and hence does not significantly affect the energy conversion efficiency of the photovoltaic cells.

A textured surface may lead to less reflection of the light by the photovoltaic module, which may be considered an advantage as it would hinder the surroundings less and could also give better aesthetics to the photovoltaic module.

Sealing Layer

The photovoltaic module further comprises (b) a sealing layer (2,4) which at least partly encapsulates a plurality of photovoltaic cells (3), wherein the sealing layer (2, 4) comprises a polyolefin elastomer composition, wherein the polyolefin elastomer composition comprises a copolymer of ethylene and an α-olefin.

The sealing layer comprises a front encapsulant layer and a back encapsulant layer. Both of said layers comprises a polyolefin elastomer composition. The front and back encapsulant layer may comprise the same or a different polyolefin elastomer composition.

The thickness of the sealing layer is for example in the range from 0.50 to 1.5 mm, for example around 0.90 (front encapsulant layer of 0.45 mm and back encapsulant layer of 0.45 mm). Preferably, for a good conversion of the sunlight to energy by the photovoltaic cells, the transmission for light in the wavelength range of 350 nm to 1200 nm of the sealing layer is on average at least 65%, for example on average at least 70%, for example on average at least 75%, for example on average at least 80% as compared to a situation without the sealing layer. For purpose of the invention, the transmission for light in the wavelength range of 350 nm to 1200 nm is determined according to ASTM D1003-13.

The term copolymer refers to a polymer made from at least two monomers. It includes, for example, copolymers, terpolymers and tetrapolymers.

The α-olefin in the ethylene-α-olefin is preferably a linear, branched or a cyclic α-olefin having 3 to 20 carbon atoms. Examples of linear α-olefins having 3 to 20 carbon atoms include but are not limited to propene, 1-butene, 4-methyl-1-pentene, 1-hexene, 1-octene, 1-decene, 1-dodecene, 1-tetradecene, 1-hexadecene and 1-octadecene. The α-olefins can also contain a cyclic structure such as cyclohexane or cyclopentane, resulting in an α-olefin such as 3-cyclohexyl-1-propene (allyl cyclohexane) and vinyl cyclohexane. Although not α-olefins in the classical sense of the term, for purposes of this invention certain cyclic olefins, such as norbornene and related olefins, are considered to be α-olefins and can be used in place of some or all of the α-olefins described above. Similarly, styrene and its related olefins (for example, -α-methylstyrene.) are α-olefins for purposes of this invention. Acrylic and methacrylic acid and their respective ionomers, and acrylates and methacrylates, however, are not α-olefins for purposes of this invention. Ethylene/acrylic acid (EAA), ethylene/methacrylic acid (EMA), ethylene/acrylate or methacrylate, ethylene/vinyl acetate and the like are not polyolefin copolymers of this invention.

When using the sealing layer in accordance with the invention, a good moisture resistance and low yellowing of the sealing layer in the photovoltaic module can be achieved.

Illustrative polyolefin copolymers include ethylene/propylene, ethylene/butene, ethylene/1-hexene, ethylene/1-octene, ethylene/styrene, and the like. Illustrative terpolymers include ethylene/propylene/1-octene, ethylene/propylene/butene, ethylene/butene/1-octene, and ethylene/butene/styrene. The copolymers can be random copolymers or block copolymers.

The α-olefin in the ethylene-α-olefin is preferably present in an amount of at least 15 wt %, preferably at least 20 wt %, more preferably at least 25 wt % and/or at most 50 wt %, preferably at most 45 wt %, preferably at most 40 wt % based on the ethylene-α-olefin. For example the α-olefin in the ethylene-α-olefin is present in an amount in the range from 25 to 45 wt % based on the ethylene-α-olefin. For purpose of the invention, the amount of α-olefin in the ethylene-α-olefin content is measured by $^{13}C$ nuclear magnetic resonance (NMR) spectroscopy using the procedure described in Randall (Rev. Macromol. Chem. Phys., C29 (2 and 3)).

The ethylene-α-olefin copolymer for example has a density of at most 0.905 g/cm3, preferably of at most 0.890 g/cm3, more preferably of at most 0.885 g/cm3, even more preferably of at most 0.880 g/cm3 and even more preferably of at most 0.875 g/cm3 and of at least 0.850 g/cm3, preferably of at least 0.860 g/cm3.

More specific examples of the types of ethylene-α-olefin copolymers useful in this invention include very low density polyethylene (VLDPE) (e.g., FLEXOMER® ethylene/hexene polyethylene made by The Dow Chemical Company), homogeneously branched, linear ethylene/α-olefin copolymers (e.g. TAFMER® by Mitsui Petrochemicals Company Limited, Queo® by Borealis and EXACT® by Exxon Chemical Company), and homogeneously branched, substantially linear ethylene/α-olefin copolymers (e.g., AFFINITY® and ENGAGE® polyethylene available from The Dow Chemical Company, FORTIFY™ polyolefin elastomers as available from SABIC).

Blends of any of the above ethylene-α-olefin copolymers can also be used in the polyolefin composition, and the ethylene-α-olefin copolymers can be blended or diluted with one or more other polymers to the extent that the polymers are (i) miscible with one another, (ii) the other polymers have little, if any, impact on the desirable properties of the polyolefin copolymer, such as optics, low modulus and/or high impact resistance. For example, the ethylene-α-olefin copolymer is present in the polyolefin composition in an amount of at least 70 w %, for example at least 75 wt %, more preferably of at least 80 wt % based on the polyolefin composition.

In a special embodiment of the invention, the polyolefin composition may be a blend of a propylene-ethylene block copolymer with the copolymer of ethylene and an α-olefin. For example, the amount of propylene-ethylene block copolymer in such blend may be in the range from 10 to 70 wt %, for example in the range from 15 to 60 wt % based on the polyolefin composition, and the amount of copolymer of ethylene and an α-olefin may be in the range from 30 to 90 wt %, for example in the range from 40 to 85 wt % based on the polyolefin composition. The sum of the amounts of propylene-ethylene block copolymer and the copolymer of ethylene and an α-olefin are preferably at least 98 wt % based on the polyolefin composition.

Preferably, the ethylene-α-olefin copolymers has a glass transition temperature (Tg) of less than −35° C., preferably less than −40° C., more preferably less than −45° C., and even more preferably less than −50° C., as measured by differential scanning calorimetry (DSC) using the procedure of ASTM D-3418-03.

Preferably, the melt flow rate of the ethylene-α-olefin copolymer is at most 100 g/10 minutes, more preferably at most 75 g/10 minutes, more preferably at most 50 g/10 minutes and even more preferably less than 35 g/10 minutes, wherein the melt flow rate of the ethylene-α-olefin copolymer is measured using ASTM D-1238 (190° C./2.16 kg). Preferably, the melt flow rate of the ethylene-α-olefin copolymer is at least 1 g/10 minutes, more preferably, the melt flow rate of the ethylene-α-olefin copolymer is at least 5 g/10 minutes, wherein the melt flow rate of the ethylene-α-olefin copolymer is measured using ASTM D-1238 (190° C./2.16 kg).

The ethylene-α-olefin copolymers in the polyolefin elastomer composition may be cured or crosslinked. However, in one embodiment, the polyolefin elastomer composition is not cured or crosslinked as this facilitates recycling of the photovoltaic module. In another embodiment, the ethylene-α-olefin copolymer in the polyolefin elastomer composition is crosslinked as this decreases creep.

(Part of) the ethylene-α-olefin copolymer in the polyolefin elastomer composition may be grafted with silane using methods known to the person skilled in the art. Suitable silanes include unsaturated silanes that comprise an ethylenically unsaturated hydrocarbyl group, such as a vinyl, allyl, isopropenyl, butenyl, cyclohexenyl or (-(meth)acryloxy allyl group, and a hydrolyzable group, such as, for example, a hydrocarbyloxy, hydrocarbonyloxy, or hydrocarbylamino group. Examples of hydrolyzable groups include methoxy, ethoxy, formyloxy, acetoxy, proprionyloxy, and alkyl or arylamino groups. Preferred silanes are the unsaturated alkoxy silanes which can be grafted onto the polymer. These silanes and their method of preparation are more fully described in U.S. Pat. No. 5,266,627.

The amount of silane used in the practice of this invention can vary widely depending upon the nature of the ethylene-α-olefin copolymer, the silane, the processing conditions, the grafting efficiency, the ultimate application, and similar factors, but typically at least 0.5, preferably at least 0.7, wt % is used based on the weight of the copolymer. Considerations of convenience and economy are usually the two principal limitations on the maximum amount of silane used in the practice of this invention, and typically the maximum amount of silane is at most 10 wt %, preferably is at most 5 wt % and more preferably is at most 2 wt % based on the weight of the ethylene-α-olefin copolymer.

In another embodiment, the polyolefin elastomer composition is cured or crosslinked, for example by curing or crosslinking of the ethylene-α-olefin copolymers in the polyolefin elastomer composition.

Crosslinking can be effected by any one of a number of different methods as known to the person skilled in the art, e.g., by the use of thermally activated initiators, e.g., peroxides and azo compounds; photoinitiators, e.g., benzophenone; radiation techniques including sunlight, UV light, E-beam and x-ray; silane, e.g., vinyl tri-ethoxy or vinyl tri-methoxy silane; and moisture curing.

The polyolefin elastomer composition may further comprise other additives, for example those additives as described for the front layer.

Photovoltaic Cells

Photovoltaic cells are known to the person skilled in the art. For example, the photovoltaic cells may be any standard commercially available crystalline or amorphous silicon solar cell or CIGS (copper indium galium selnide) thin film. The person skilled in the art will know what type of electrical connection to use, for example the plurality of photovoltaic cells may be electrically connected to each other in a parallel electrical configuration, or alternatively in series configuration. For example, the plurality of cells may be divided in various groups, wherein each cell of a group is connected in series to the other cells of that group, while groups may be connected in parallel. The electrical conductors may be metal strips such as strips comprising copper aluminum and/or silber or, in the alternative, may be metal wires.

Back Layer

The back layer of the photovoltaic module of the invention comprises a first polypropylene layer comprising a second polypropylene composition, wherein the second polypropylene composition comprises a polypropylene and optionally a reinforcing filler.

In one embodiment, the back layer consists of the first polypropylene layer comprising a second polypropylene composition, wherein the second polypropylene composition comprises a polypropylene and a reinforcement filler. The layer thickness of the first polypropylene layer is typically in the range from 0.25 to 6.0 mm.

In another embodiment, the back layer, in addition to the first polypropylene layer, further comprises a second polypropylene layer and a third polypropylene layer, wherein the second polypropylene layer is a reinforced polypropylene structure, for example a polypropylene honeycomb structure or a polypropylene foam. In said embodiment, the first respectively third polypropylene layer comprise a second respectively third polypropylene composition.

In said embodiment, the thickness of the back layer may for example range from 4.0 to 60 mm and the thickness of the first and/or third layer may for example range from 0.25 to 2.0 mm.

An advantage of using a honeycomb structure or a polypropylene foam is that it provides stiffness while at the same time being light-weight, which facilitates the installation of the photovoltaic module. In addition, light-weight also has the advantage that it can be mounted on most existing roofs and that the existing roof does not need to be adapted to a higher roof load bearing capacity.

The third polypropylene composition comprises a polypropylene and optionally a reinforcing filler. The second and third polypropylene composition in the first respectively third polypropylene layer in the back layer may be the same, or different.

Preferably, the first and third polypropylene layer are in direct contact with the reinforced polypropylene structure. Most preferably, the back layer consists of the first, second and third polypropylene layers.

The second polypropylene layer in the back layer can comprise, for example the honeycomb core material or a polypropylene foam, both of which are commercially available.

Other examples of reinforced polypropylene structures include but are not limited to other structures comprising a stiffening element configured to improve the stiffness and/or impact properties of the photovoltaic module.

For example, the stiffening element can comprise vertical stiffening element(s) which extend in a z direction, horizontal stiffening element(s) which extend in an x direction, diagonal stiffening element(s) which extend between a z and x direction, or a combination comprising one or more of the foregoing. The stiffening element can be straight, curved, or jagged. The geometry formed by the stiffening elements defines the openings in the support layer. These openings can have various cross-sectional geometries (in the x-z plane) including polygonal and/or rounded, such as round, oblong, multi-sided, and combinations comprising at least one of the foregoing. For example, the multi-sided cross-sectional geometry can be triagonal, quatragonal, pentagonal, hexagonal (e.g., honeycomb), heptagonal, octagonal, and the like.

The first and/or third polypropylene layer in the back layer, may for example be a continuous glass fiber reinforced tape. Preferably, in case a continuous glass fiber reinforced tape is used, at least two tape layers are applied in the first and/or third polypropylene layer. The stacking of the tape layers is preferably done such that the tapes are in a quasi isotropic lay-up (for example a +0°/90° stacking).

Examples of glass fiber reinforced tapes include but are not limited to UDMAX™ tapes as commercially available from SABIC or Polystrand™ tapes as commercially available from PolyOne. Furthermore, such tapes are also disclosed in WO2016/142786A1, hereby incorporated by reference, WO2016/142781A1, hereby incorporated by reference, WO2016/142784A1, hereby incorporated by reference.

Another example of a continuous glass fiber reinforced tape is for example described in WO2019122317A1, hereby incorporated by reference and in WO2019122318A1, hereby incorporated by reference.

Examples of reinforcement fillers include but are not limited to talc, mica, glass fibers, wollastonite, clay and carbon. Short and long glass fibers may be used, more preferably continuous long glass fibers.

In an embodiment, the element may have a plurality of elongate, wireshaped, metal reinforcement elements, such as metal wires, preferably steel wires, incorporated within the back layer, distributed over the width of the back layer and extending along the length of the back layer. Such a element is highly resistant to burning objects from the outside. The plurality of elongate metal reinforcement elements may provide sufficient protection against such objects passing through the element by melting the element material, in particular the front and back layer, or at least provide sufficient delay. The plurality of elongate metal reinforcement elements may be incorporated within the back layer by lamination, extrusion or injection moulding.

It is preferred that the first reinforced polypropylene layer comprises at least 95 wt % of a the second polypropylene composition based on the first reinforced polypropylene layer, more preferably at least 96 wt %, more preferably at least 97 wt %, for example at least 98 wt %, for example at least 99 wt %, for example at least 99.5 wt % of the second polypropylene composition based on the first reinforced polypropylene layer. For example the first reinforced polypropylene layer consists of the second polypropylene composition.

The second polypropylene composition preferably comprises at least 95 wt % of the sum of the polypropylene and the optional reinforcing filler and an optional flame retardant, for example at least 96 wt %, for example at least 97 wt %, for example at least 98 wt %, for example at least 99 wt %, for example at least 99.5 wt % of polypropylene and optional reinforcing filler and an optional flame retardant based on the second polypropylene composition.

The back layer preferably has a flexural stiffness in at least one direction of at least 5 Nm, wherein the flexural stiffness is measured according to ASTM D790M (Three point bending with span of 40 cm), more preferably a flexural stiffness of at least 50 Nm, even more preferably a flexural stiffness of at least 100 Nm, in particular a flexural stiffness of at least 250 Nm, most preferably a flexural stiffness of at least 400 Nm.

Preferably, the back layer has a flexural stiffness to weight/$m^2$ ratio of at least 1.5 $Nm^3$/kg, wherein the flexural stiffness is measured according to ASTM D790M (Three point bending with span of 40 cm) and wherein the weight/$m^2$ is the weight (in kg) per square meter of the back layer. More preferably, the back layer has a flexural stiffness to weight/$m^2$ ratio of at least 20, even more preferably of at least 40, more preferably of at least 70, even more preferably of at least 120, most preferably of at least 140 $Nm^3$/kg.

Therefore, the invention also relates to a photovoltaic module of the invention wherein the back layer has a flexural stiffness of at least 5 Nm, wherein the flexural stiffness is measured according to ASTM D790M (Three point bending with span of 40 cm), more preferably a flexural stiffness of at least 50 Nm, even more preferably a flexural stiffness of at least 100 Nm, in particular a flexural stiffness of at least 250 Nm, most preferably a flexural stiffness of at least 400 Nm and/or a flexural stiffness to weight/$m^2$ ratio of at least 1.5 $Nm^3$/kg, wherein the flexural stiffness is the lowest flexural stiffness measured in a direction of the back layer and wherein the flexural stiffness is measured according to ASTM D790M (Three point bending with span of 40 cm) and wherein the weight/$m^2$ is the weight (in kg) per square meter of the back layer. More preferably, the back layer has a flexural stiffness to weight/$m^2$ ratio of at least 20, even more preferably of at least 40, more preferably of at least 70, even more preferably of at least 120, most preferably of at least 140 $Nm^3$/kg.

The second and third polypropylene composition may comprises additives besides the optional flame retardant. Suitable examples of additives are known to the person skilled in the art and include those as described herein. Preferably, at least part of the back layer comprises a flame retardant.

As an example, the flame retardant in the back layer may be a mixture of an organic phosphate compound, an organic phosphoric acid and a zinc oxide; wherein the weight ratio of phosphate compound to phosphoric acid compound is from 1:0.01 to 1:2 and wherein the zinc oxide is present in an amount of from 2-10 wt. % based on the weight of the flame retardant. In an embodiment, the flame-retardant is a mixture of piperazine pyrophosphate, phosphoric acid and zinc oxide, more preferably a mixture of 50-60 wt. % of piperazine pyrophosphate, 35-45 wt. % phosphoric acid and 3-6 wt. % of zinc oxide, all based on the total weight of the polymer composition. For the avoidance of doubt the flame retardant is a halogen-free flame retardant.

In such mixture, the weight ratio of organic phosphate compound to phosphoric acid compound may be from 1:0.01 to 1:2. Preferably the weight ratio is from 1:1 to 1:2.

The organic phosphate compound in the mixture may be selected from piperazine pyrophosphate, piperazine polyphosphate and one or more combinations thereof. The phosphoric acid compounds in the mixture may be selected from phosphoric acid, melamine pyrophosphate, melamine polyphosphates, melamine phosphate and one or more combinations thereof. It is preferred that the phosphoric acid compound is melamine phosphate. The zinc oxide may be used in an amount of from 2-10 wt. %, more preferably from 3-6 wt. % based on the weight of the flame retardant.

An example of a suitable flame retardant is a mixture of 50-60 wt. % of piperazine pyrophosphate, 35-45 wt. % phosphoric acid and 3-6 wt. % of zinc oxide, all based on the total weight of the flame retardant. This mixture is commercially available as e.g. ADK STAB FP-2200 available from Adeka Palmarole.

A further example of a suitable flame retardant is commercially available as ADK STAB FP-2100 JC.

The polypropylene present in the second and/or third polypropylene composition (since present at the opposite side of the sunlight facing side of the photovoltaic elements) does not need to have a transmission for light.

For example, a suitable polypropylene may be a heterophasic propylene copolymer. For example the heterophasic propylene copolymer may consist of a propylene-homopolymer or propylene copolymer matrix and an ethylene-α-olefin copolymer, for example an ethylene-propylene copolymer.

The person skilled in the art is aware how to prepare heterophasic propylene copolymers. The preparation of such polypropylenes is, for example, described in Moore, E. P. (1996) Polypropylene Handbook. Polymerization, Characterization, Properties, Processing, Applications, Hanser Publishers: New York.

Heterophasic propylene copolymers can be made by any known polymerization technique as well as with any known polymerization catalyst system. Regarding the techniques, reference can be given to (sequential)-slurry, solution or gas phase polymerizations; regarding the catalyst system reference can be given to Ziegler-Natta, metallocene or single-site catalyst systems. All are, in themselves, known in the art. In addition, heterophasic propylene copolymers are commercially available.

To be able to prepare a first reinforced polypropylene layer having a uniform thickness and/or with an acceptable high speed processing behavior, it is preferred that the polypropylene in the second polypropylene composition has a molecular weight distribution (MWD) of at least 4.0, for example at least 5.0, for example at least 6.0 and/or at most 12, for example at most 10.0, for example the propylene homopolymer or propylene-ethylene copolymer according to the invention has a molecular weight distribution in the range from 5.0 to 10.0, wherein MWD is calculated by dividing the weight average molecular weight Mw by the number average molecular weight Mn and wherein Mw and Mn are measured according to ASTM D6474-12.

The melt flow rate of the second and/or third polypropylene composition is in principle not critical. The optimal range depends on the process with which the layer is prepared and can easily be selected by the person skilled in the art using routine experimentation.

For example, the polypropylene in the second and/or third polypropylene composition may be a heterophasic propylene copolymer.

The reinforcing filler may be selected from the group consisting of inorganic fillers and glass fibers, for example the reinforcing filler may be talc, mica, short glass fibers, and long glass fibers, and is preferably a continuous long glass fiber.

The second polypropylene composition may be prepared from polypropylene with long glass fibers, for example in a process as described in WO2009/080281, the disclosure of which is hereby incorporated by reference.

Pellets comprising a thermoplastic polymer sheath intimately surrounding glass filaments, which glass filaments are covered at least in part with an impregnating agent and extend in a longitudinal direction of said pellets, are for example commercially available from SABIC under the brand name STAMAX.

For example, the second polypropylene composition may also be formed by continuous long glass fiber tapes, as described above.

Preparation of the Photovoltaic Module

In another aspect, the invention relates to a process for the preparation of the photovoltaic module of the invention. Such process can be an extrusion process or a lamination process.

In an extrusion process, the molten polymer material is fed via a die and solidified to form a layer structure. Multiple layer structures can be produced, e.g. by a coextrusion process which means simultaneous extrusion of two or more, the same or different polymer materials through the same die.

In a lamination process, two or more premade layers, e.g. two polymeric layer, are adhered together in a lamination equipment using heat and pressure.

For example, the photovoltaic module of the invention may be prepared in a process comprising the sequential steps of:
 (a) providing the front layer, the sealing layer comprising the plurality of photovoltaic cells and the back layer
 (b) assembling the front layer, the sealing layer and the back layer such that the front layer and the back layer are in contact with the sealing layer and
 (c) heating the assembly such that at least part of the sealing layer melts; and
 (d) pressing the assembly at the heated conditions to obtain a laminated assembly
 (e) cooling to laminated assembly to obtain the photovoltaic module of the invention.

Preferably in the heating step, the assembly is heated to a temperature such that the front and back layer do not melt, for example the temperature of this heating step is chosen such that the front layer obtains a temperature of at least 5° C. below the melting temperature of the front layer. In practice, the temperature of the heating step is chosen as high as possible to allow a maximum adherence between the sealing layer and the front respectively the back layer, while at the same time the temperature is not too high, so that the front and back layer remain solid or so that the back layer remains solid and the front layer melts.

During such lamination process, the structural integrity of the back layer and of the assembly is maintained and the photovoltaic module of the invention can be prepared with consistent dimensions. Furthermore, lamination is an easy process, which has short cycle times as it can be performed at high speed.

It should be clear to the person skilled in the art, that the layers may also be laminated in part.

For example the front and sealing layer may first be laminated onto one another, after which the laminated front and sealing layer may be laminated onto the back layer.

in addition to the front layer, the sealing layer and the back layer, the photovoltaic module may further comprise other layers such as a protective (UV and/or fire) coating on the sunlight facing side of the front layer. Preferably, the photovoltaic module of the invention does not comprise a metal layer, as this will make recycling of the photovoltaic module of the invention more difficult. It is preferred that all layers of the photovoltaic module comprise polyolefins. For example, the photovoltaic module comprises at least 95 wt % polyolefins based on the photovoltaic module excluding the photovoltaic cells, reinforcing fillers and flame retardants. Preferably, each of the the front layer, the sealing layer and the back layer comprises at least 95 wt % polyolefins based on the total polymer in said layer.

This has the advantage of a good adhesion of the layers, a good moisture resistance, a good impact and allows for easy production of the photovoltaic module, for example by (low temperature) lamination.

In another aspect, the invention relates to the photovoltaic module of the invention, wherein the module consists of the front layer the sealing layer, the photovoltaic cells and the back layer.

The photovoltaic module of the invention may be used as such, but may also be used in combination cover, for example to provide a further improved resistance against environmental influences such as hail, sun or rain. An example of such cover is a rigid, UV protective cover, having a transmission of light in the wavelength range of 350 nm to 1200 nm of on average at least 65%. Such cover may for example be prepared from glass or polycarbonate.

It is noted that the invention relates to all possible combinations of features described herein, preferred in particular are those combinations of features that are present in the claims. It will therefore be appreciated that all combinations of features relating to the module according to the invention; all combinations of features relating to the process according to the invention and all combinations of features relating to the use according to the invention are described herein.

It is further noted that the term 'comprising' does not exclude the presence of other elements. However, it is also to be understood that a description on a product/composition comprising certain components also discloses a product/composition consisting of these components. The product/composition consisting of these components may be advantageous in that it offers a simpler, more economical process for the preparation of the product/composition. Similarly, it is also to be understood that a description on a process comprising certain steps also discloses a process consisting of these steps. The process consisting of these steps may be advantageous in that it offers a simpler, more economical process.

The invention is now elucidated by way of the following examples, without however being limited thereto.

EXAMPLES

Figure 1:
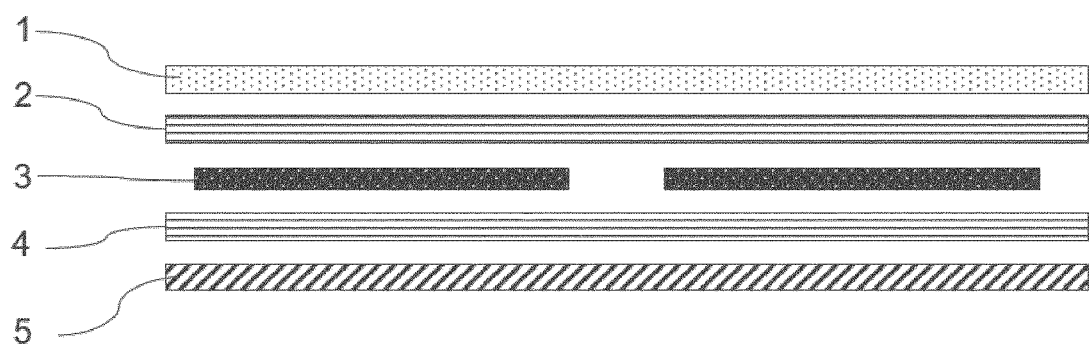
FIG. 1 (FIG. 1) shows a schematic representation of one embodiment of the photovoltaic module of the invention, in which 1 indicates the front layer, 2 indicates the front encapsulant layer, 3 indicates the photovoltaic cells, 4 indicates the back encapsulant layer and 5 indicates the back layer.

Measuring methods: transmittance curves (full spectrum from 200-2500 nm) were measured using a Perkin Elmer Lambda 950 according to ASTM D1003-13 (used lamp: halogen in combination with deuterium lamp). For the front layer the transmission in the wavelength range of 350 nm to 1200 nm was determined and compared to the transmission without the front layer.

The following materials were used:
Glass front layer: Super White, Flat solar glass, thickness 3.2 mm, Scheuten, NL.
EVA Encapsulant sealing layer: Photocap P15580, manufactured by STR, Ethylene vinyl acetate, thickness 0.45 mm
TPT back layer: Tedlar (PVF by DuPont)-PET-Tedlar (PVF by DuPont) foil 0.3 mm, ICOSOLAR 3374 foil from Isovoltaic; PVF is polyvinylfluoride from DuPont
PP front layer: one-layer sheet of propylene-ethylene random copolymer with a thickness of 0.1, 0.45 and 0.7 mm. The propylene-ethylene random copolymer had a Melt Flow Rate of 1.7 dg/min as measured according to ISO1133 at 230° C./2.16 kg and an ethylene content of 3.5 wt % as measured using $^{13}C$ NMR.
Polyethylene Encapsulant sealing layer 1 (PE1): DaiNippon Solar PV-FS Z68 with thickness of 0.565 mm. A silane modified polyethylene elastomer or low density polyethylene copolymer with propene, butene and hexane.
Polyethylene Encapsulant sealing layer 2 (PE2): Renewsys Consery E360 with a thickness of 0.45 mm. A silane modified polyethylene elastomer or low density polyethylene copolymer. In order to be crosslinked this encapsulant requires curing (e.g. 12 minutes at 150° C.).
PP composite back layer 1 (PP composite 1): 70 wt % LGF (long glass fiber) PP (polypropylene) laminate with a thickness of 2 mm and a flexural stiffness of 10 Nm (according to ASTM D790M, Three point bending with span of 40 cm) and a weight/m$^2$ of 3.28 kg/m$^2$ (stiffness to weight balance of 3). The laminate consists of a symmetrical stack of 8 sheets of UDMAX™ GPP 45 70 Tape)(0°/90°/0°/90°/90°/0°/90°/0°. The panel was laminated on a double belt press at temperature of 180° C., pressure of 0.6 bar and speed of 1 m/min.
PP sandwich back layer 2 (PP composite 2): PP sandwich panel from Thermhex Waben GmbH (12THPP120-GFPP820)(RV) with a thickness of 12 mm and a flexural stiffness of 590 Nm in length direction and 475 Nm in width direction (according to ASTM D790M, three point bending with span of 40 cm) and a weight/m$^2$ of 3.2 kg/m$^2$ (stiffness to weight balance of 150), consisting of PP honeycomb core and skins with thickness of 0.5 mm consisting of 2 layers 70 wt % LGF (long glass fiber) PP (polypropylene) tape, UDMAX™

GPP 45 70)(0°/90°. Panel was laminated on double belt press at temperature of 180° C.

Electrical components: Solar Cell, mono-crystalline, p-type, 4 Busbar from NSP, Soldering flux Kester 952-S and Tabbing and Wire from Ulbrich (5×0.3 mm and 1×0.2 mm).

Figure 2:
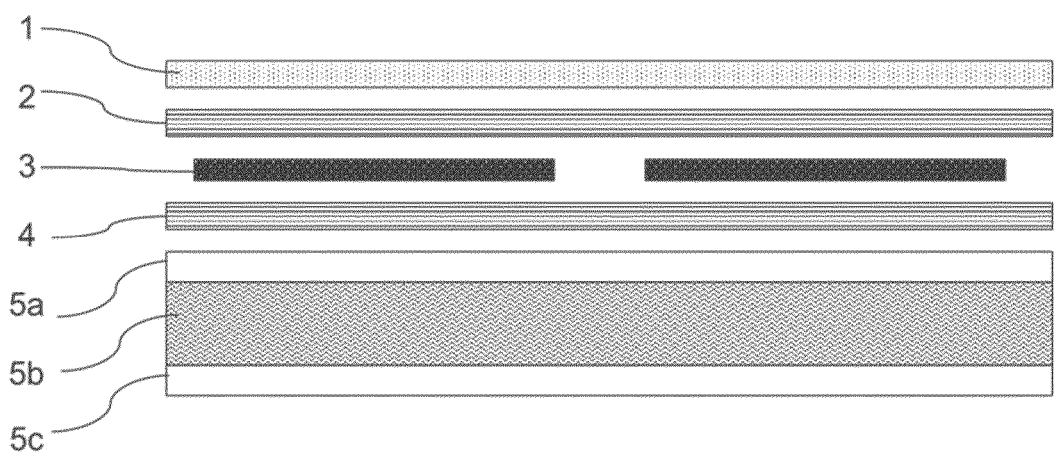
FIG. 2 (FIG. 2) shows a schematic representation of another embodiment of the photovoltaic module of the invention, in which 1 indicates the front layer, 2 indicates the front encapsulant layer, 3 indicates the photovoltaic cells, 4 indicates the back encapsulant layer, 5a indicates the first polypropylene layer, 5b indicates the second polypropylene layer and 5c the third polypropylene layer. wherein the second polypropylene layer is a reinforced polypropylene structure, for example a polypropylene honeycomb structure or a polypropylene foam.

The modules tested had the lay-up sequence as indicated in FIG. 1 (samples 1 to 4) and FIG. 2 (sample 5).

Example 1

Glass foil single cell modules were produced on a 3 chamber vacuum laminator (3S, Meyer Burger) using the following conditions, evacuation time of 270 sec, holding time of 600 sec, temperature 150° C. and pressure of 900 mbar (600 mbar/min).

Full polyolefin single cell modules were produced on a 3 chamber vacuum laminator (3S, Meyer Burger) using the following conditions, evacuation time of 300 sec, holding time of 300 sec, temperature 140° C. and pressure of 900 mbar (600 mbar/min).

All produced test modules showed no indications of cell breakage from electroluminescence images.

Current-Voltage, or I-V measurements were carried out under Standard Test Conditions (25° C., 1000 W/m2) using a Class-AAA sun simulator (PASAN). The precision of temperature and irradiance was controlled in accordance with MQT02 from IEC 61215-2:2016 norm.

TABLE 1 shows the % relative Cell to Module change in power output.

|  | sample 1 | sample 2 | sample 3 |
|---|---|---|---|
| Front layer | Glass | PP 0.1 mm | PP 0.7 mm |
| Encapsulant | EVA | PE 1 | PE 1 |
| Back layer | TPT | PP Composite 1 | PP Composite 1 |
| relative cell to module change [%] | | | |
| Isc | −4.73 | −5.09 | −5.91 |
| Voc | −0.22 | −0.33 | −0.19 |
| FF | −4.49 | −4.18 | −4.55 |
| Pm | −8.83 | −8.77 | −10.01 |

I-V (current-voltage) measurements (Isc, Voc, FF and Pm) show that the performance of the polyolefin based modules is comparable to the traditional glass-foil based module (sample 1). There is hardly any difference in open-circuit Voltage (Voc) and the fill factor (FF), and only slightly higher short-circuit Current (Isc) losses for sample 2 and 3. The slightly higher losses in maximum Power output (Pm) for sample 3 is related to the increased light absorption in the thicker 0.7 mm PP front layer. Samples 2 and 3 meet the requirements of the International Electrotechnical Commission (IEC) for solar panels.

Example 2

Full polyolefin solar modules, of 2×2 Cells in series were produced on a 3 chamber vacuum laminator (3S, Meyer Burger) using the following conditions, evacuation time of 300 sec, holding time of 300 sec, temperature 140° C. and pressure of 900 mbar (300 mbar/min).

All produced test modules showed no indications of cell breakage from electroluminescence image and demonstrated expected IV characteristics.

The modules were subjected to below critical IEC qualification tests;

Thermal cycling, 200 cycles, TC200, according to MQT 11-IEC61215-1:2016,

Damp-Heat test, 1000 cycles, DH1000, according to MQT 13-IEC61215-1:2016,

Thermal cycling (50 cycles) and subsequent Humidity Freeze (10 cycles), TC50-HF10, according to MQT 11+MQT 12-IEC61215-1:2016.

The performance of the modules after qualification test was evaluated with:

Visual inspection, according to MQT 1-IEC61215-1:2016,

I-V measurements at STC, according to MQT 06.1-IEC61215-1:2016,

Electroluminescence (EL) imaging and

Wet leakage test, 500V, according to MQT 15-IEC61215-1:2016 and

Static mechanical load test (wind load) according to IEC MQT16 IEC61215-2:2016.

Samples 4 and 5 were also subjected to Hail impact tests according to MQT17 IEC61215-2:2016. The sample 5 was tested not supported, which means that the panel was only supported in the corners, with a distance from the wall of 4 cm. Sample 4 was tested supported, that means that it was placed on a rigid flat support (gypsum wall).

TABLE 2

|  | sample 1 | Sample 4 | sample 5 |
|---|---|---|---|
| Front layer | Glass | PP 0.7 mm | PP 0.7 mm |
| Encapsulant | EVA | PE1 | PE 1 |
| Back layer | TPT | PP Composite 1 | PP Composite 2 |
| Weight [kg/m2] | 11 | 5 | 5 |
| TC200 | | | |
| Pm loss [%] | | 0.8% | |
| Visual inspection | | pass | |
| Wet leakage, 500 V | | pass | |
| DH100 | | | |
| Pm loss [%] | | 1.7% | |
| Visual inspection | | pass | |
| Wet leakage, 500 V | | pass | |
| TC50-HF10 | | | |
| Pm loss [%] | | 1.6% | |
| Visual inspection | | pass | |
| Wet leakage, 500 V | | Pass | |
| Hail Impact | | supported | not supported |
| Pm loss [%] | | pass | pass |
| Visual inspection | | pass | pass |
| Wet leakage, 500 V | | pass | pass |
| Static Mechanical load test | | | |
| Pressure [Pa] | | | >2800 |

As shown in Table 2, the photovoltaic elements of the invention (samples 4 and 5) have a significantly lower weight compared to traditional glass-foil modules with a weight of typically 11 kg/m2 (>50% weight reduction). This is a major advantage during handling on the roof.

Furthermore Table 2 shows that the photovoltaic elements of the invention pass the critical IEC climate chamber test: After climate chamber testing, the samples do not show any significant visual defects, the samples pass the wet leakage test at 500V, and show only a minor reduction (<5%) in maximum power output Pm.

In addition, Table 2 shows that the photovoltaic elements of the invention also can pass the hail impact test as tested on a 2 by 2 cells panel. The power loss when scaled to a full size panel of 72 cells will be below 5% and the full size panel will also pass the hail impact test.

Moreover Table 2 also shows that photovoltaic elements of the invention pass the static mechanical load (wind load) test as determined according to IEC MQT16 IEC61215-2: 2016. Up to a load of 2800 Pa no damage was detected and the panels pass the 2400 Pa IEC requirement.

Example 3

Full size, full polyolefin solar modules, of 6×12 Cells were produced on a vacuum laminator (Ecoprogetti Ecolam 05) using the following conditions, evacuation time of 240 sec, holding time of 600 sec, pressure of 300 mbar and temperature of 125° C. and 150° C., respectively.

The modules were subjected to the below IEC qualification tests; Thermal cycling, 200 cycles, TC200, according to MQT 11-IEC61215-1:2016, Damp-Heat test, 1000 cycles, DH1000, according to MQT 13-IEC61215-1:2016, Materials creep test at 95° C., according to MST37-IEC61730

The performance of the modules after qualification test was evaluated by visual inspection.

Table 3 shows clearly that both samples 6 and 7 pass the Thermal cycling and Damp Heat test, however only sample 7 also passes the materials creep test. After prolonged exposure to 95° C., samples 6 showed severe delamination or detachment of the PP frontsheet.

From this, it can be concluded that in order to have a good creep at 95° C., crosslinking of the sealing layer is desired. Therefore, in a preferred embodiment, the invention relates to the photovoltaic module of the invention, wherein the sealing layer is crosslinked.

TABLE 3

|  | sample 6 | sample 7 |
| --- | --- | --- |
| Front layer | PP 0.45 mm | PP 0.45 mm |
| Encapsulant | PE2 | PE2 |
| Back layer | PP Composite 2 | PP Composite 2 |
| Lamination Temperature [° C.] | 125 | 150 |
| TC200 | | |
| Visual inspection DH100 | pass | pass |
| Visual inspection Materials Creep @ 95° C. | pass | pass |
| Visual inspection | fail | pass |

The examples show that photovoltaic elements of the invention have a performance comparable to the traditional glass-foil based modules, whereas at the same time being significantly lighter than these traditional modules, which facilitates handling and allows placement of these modules on roofs without the need to strengthen the construction of the roof.

The examples also show that this can be achieved by a photovoltaic module of the invention wherein all layers of the photovoltaic module comprise polyolefins.

The invention claimed is:
1. A photovoltaic module comprising
  (a) a front layer arranged on the sunlight facing side of the photovoltaic module wherein the front layer comprises at least 95 weight percent of a first polypropylene composition based on total weight of the front layer, wherein the polypropylene composition comprises at least 95 weight percent of a random copolymer of propylene and a comonomer wherein the comonomer is ethylene or an alpha olefin of 4 to 12 carbon atoms, provided that if the comonomer is ethylene the ethylene is present in amounts of no greater than 7 weight percent based on total weight of the random copolymer, wherein the transmission of the front layer for light in the wavelength range of 350 nm to 1200 nm as determined according to ASTM D1003-13, is on average at least 65% as compared to a situation without the front layer,
  (b) a sealing layer which at least partly encapsulates a plurality of photovoltaic cells by having a first portion of the sealing layer above the plurality of photovoltaic cells and a second portion of the sealing layer below the plurality of photovoltaic cells where each of the first portion and the second portion of the sealing layer are a monolayer,
  wherein the sealing layer comprises a polyolefin elastomer composition comprising an ethylene-alpha-olefin copolymer wherein the amount of alpha olefin is less than 40 weight percent based on weight of the ethylene-alpha-olefin copolymer and wherein the sealing layer is characterized by a transmission of the sealing layer for light in the wavelength range of 350 nm to 1200 nm as determined according to ASTM D1003-13, is on average at least 65% as compared to a situation without the sealing layer, and
  (c) a back layer, wherein the back layer comprises a first polypropylene layer comprising a second polypropylene composition comprising a polypropylene, wherein (i) the second polypropylene composition comprises a reinforcing filler, and/or (ii) the back layer further comprises a second polypropylene layer adjacent to the first polypropylene layer and a third polypropylene layer adjacent to the second polypropylene layer on a side opposite from the first polypropylene layer, wherein the second polypropylene layer is a polypropylene foam or a polypropylene honeycomb structure and wherein the back layer has a flexural stiffness in at least one direction of at least 5 Nm, wherein the flexural stiffness is measured according to ASTM D790M (Three point bending with span of 40 cm) and/or a flexural stiffness to weight/m$^2$ ratio of at least 1.5 Nm$^3$/kg, wherein the flexural stiffness is the lowest flexural stiffness the back layer and wherein the flexural stiffness is measured according to ASTM D790M (Three point bending with span of 40 cm) and wherein the weight/m$^2$ is the weight (in kg) per square meter of the back layer,
  wherein the first portion of the sealing layer is arranged between and in direct contact with the front layer and the plurality of photovoltaic cells and the second portion of the sealing layer is arranged between and in direct contact with the back layer and the plurality of photovoltaic cells.

2. The photovoltaic module according to claim 1, wherein the first polypropylene composition further comprises a mixture of light stabilizing additives, said mixture of light stabilizing additives comprising:
  i) a high molecular weight hindered tertiary amine light stabilizer having a weight average molecular weight (measured by ASTM D6474-12) of at least 1600 g/mol;
  ii) a low molecular weight hindered secondary amine light stabilizer (s-LM-HALS) having a weight average molecular weight (measured by ASTM D6474-12) of below 1000 g/mol,
  iii) an ultraviolet synergist, and iv) an ultraviolet absorber, and c) a mixture of antioxidant additives, said mixture of antioxidant additives comprising
i) a phenolic antioxidant and
ii) a phosphite additive.

3. The photovoltaic module according to claim 1, wherein the ethylene-alpha-olefin copolymer in the polyolefin elastomer composition is crosslinked.

4. The photovoltaic module according to claim 1, wherein the random copolymer is a propylene-ethylene copolymer having
   i) a molecular weight distribution (MWD) of at least 5.0 and at most 10.0, wherein MWD is calculated by dividing the weight average molecular weight Mw by the number average molecular weight Mn and wherein Mw and Mn are measured according to ASTM D6474-12 and/or
   ii) a melt flow rate in the range from 0.50 to 7.0 dg/min as determined using ISO1133: 2011, at 2.16 kg and 230° C.

5. The photovoltaic module according to claim 1, wherein the alpha-olefin in the ethylene-alpha-olefin copolymer is a linear, branched or a cyclic alpha-olefin having 3 to 20 carbon atoms and/or wherein the ethylene-alpha-olefin copolymer has a density of from 0.860 g/cm$^3$ to 0.905 g/cm$^3$.

6. The photovoltaic module according to claim 1, wherein the back layer comprises the second polypropylene layer and the third polypropylene layer, and the first and third polypropylene layer are in direct contact with the second polypropylene layer.

7. The photovoltaic module according to claim 1, wherein the back layer consists of the first, second and third polypropylene layer.

8. The photovoltaic module according to claim 1, wherein the polypropylene in the second polypropylene composition is a heterophasic propylene copolymer.

9. The photovoltaic module according to claim 1, wherein the module consists of the front layer the sealing layer, the photovoltaic cells and the back layer.

10. The photovoltaic module according to claim 1, wherein each of the front layer, the sealing layer and the back layer comprises at least 95 wt % polyolefins based on the total polymer in said layer.

11. A process for the preparation of the photovoltaic module of claim 1, comprising the sequential steps of:

(a) providing the front layer, the sealing layer comprising the plurality of photovoltaic cells and the back layer
(b) assembling the front layer, the sealing layer and the back layer such that the front layer and the back layer are in contact with the sealing layer to form an assembly;
(c) heating the assembly such that at least part of the sealing layer melts;
(d) while heating, pressing the assembly to obtain a laminated assembly and
(e) cooling the laminated assembly to obtain the photovoltaic module.

12. A structure comprising the photovoltaic module of claim 1 on a roof or on a facade.

13. The photovoltaic module of claim 2 characterized by one or more of the following
   the high molecular weight hindered tertiary amine light stabilizer comprises 1, 3, 5-triazine-2, 4, 6-triamine or N,N"-[1,2-ethanediylbis [[[4,6-bis [butyl (1,2,2,6,6-pentamethyl-4-piperidinyl) amino]-1,3,5-triazine-2-yl] imino]-3, 1-propanediyl]]-bis [N',N"-dibutyl-Isr,N"-bis (1,2,2,6,6-pentamethyl-4-piperidinyl);
   the low molecular weight hindered secondary amine light stabilizer comprises a mixture of esters of 2, 2, 6, 6-tetra-methyl-4-piperidinol and one or more fatty acids;
   the ultraviolet synergist comprises an n-alkyl-3,5-dialkylated 4-hydroxybenzoate;
   the ultraviolet absorber comprises 2-(2'-5 hydroxy-3'-t-butyl-5'-methylphenyl)-5-chlorobenzotriazole;
   the phenolic antioxidant comprises tetrakis[methylene-3 (3,5'-di-t-butyl-4-hydroxyphenyl) propionate] methane or 1,3,5-tris (4-t-butyl-2,6-dimethyl-3-hydroxybenzyl)-isocyanurate;
   the phosphite additive comprises tris (2,4-di-t-butylphenyl) phosphite;
   the mixture of antioxidant additives includes calcium stearate.

14. The photovoltaic module of claim 4 wherein the random copolymer in the first polypropylene composition is a propylene-ethylene copolymer having an amount of moieties derived from ethylene in the range from 1.0 to 7.0 wt % based on the propylene-ethylene copolymer.

* * * * *